United States Patent [19]
Lake et al.

[11] Patent Number: 5,663,598
[45] Date of Patent: Sep. 2, 1997

[54] ELECTRICAL CIRCUIT BONDING INTERCONNECT COMPONENT AND FLIP CHIP INTERCONNECT BOND

[75] Inventors: Rickie C. Lake, Eagle; Mark E. Tuttle, Boise, both of Id.

[73] Assignee: Micron Communications, Inc., Boise, Id.

[21] Appl. No.: 553,762

[22] Filed: Oct. 23, 1995

Related U.S. Application Data

[62] Division of Ser. No. 166,747, Dec. 13, 1993, Pat. No. 5,480,834.
[51] Int. Cl.$^6$ .................................................. H01L 23/48
[52] U.S. Cl. .............................................. 257/737; 257/778
[58] Field of Search ..................................... 257/778, 750, 257/737

[56] References Cited

U.S. PATENT DOCUMENTS

| | | | |
|---|---|---|---|
| 3,871,014 | 3/1975 | King et al. | 357/67 |
| 3,871,015 | 3/1975 | Lin et al. | 357/67 |
| 4,582,724 | 4/1986 | Cooper | 427/125 |
| 4,922,321 | 5/1990 | Arai et al. | 357/68 |
| 5,029,585 | 7/1991 | Lieber et al. | 128/642 |
| 5,074,947 | 12/1991 | Estes et al. | 156/307.3 |
| 5,196,371 | 3/1993 | Kulesza et al. | 437/183 |
| 5,235,140 | 8/1993 | Reele et al. | 174/267 |
| 5,384,284 | 1/1995 | Doan et al. | 437/190 |

FOREIGN PATENT DOCUMENTS

| | | |
|---|---|---|
| 3702354 A1 | 1/1987 | Germany . |
| 63-276237 | 11/1988 | Japan . |
| 2-139933 | 11/1988 | Japan . |
| 5-335316 | 12/1993 | Japan . |

OTHER PUBLICATIONS

Tummala, Rao R. & Rymaszewski, Eugene J., "Microelectronics Packaging Handbook", Jan. 1, 1989 pp. 366–391; Van Nostrand Reinhold.

*Primary Examiner*—Tom Thomas
*Assistant Examiner*—Roy Potter
*Attorney, Agent, or Firm*—Wells, St. John, Roberts, Gregory & Matkin, P.S.

[57] ABSTRACT

An inexpensive low contact resistance electrical bonding interconnect having a metal bond pad portion and conductive epoxy portion. The conductive epoxy portion comprises a metal oxide reducing agent for reducing oxides formed before and/or during the fabrication of the bonding interconnect. The bonding interconnect is used to bond a die pad to a supporting substrate thereby forming a surface mount device.

14 Claims, 2 Drawing Sheets

ELECTRICAL CIRCUIT BONDING INTERCONNECT COMPONENT AND FLIP CHIP INTERCONNECT BOND

RELATED PATENT DATA

This patent resulted from a divisional application of U.S. patent application Ser. No. 08/166,747, filed on Dec. 13, 1993, entitled "An Electrically Bonding Interconnect Having A Metal Bond Pad Portion And Having A Conductive Epoxy Portion Comprising An Oxide Reducing Agent" listing the inventors as Rickie C. Lake and Mark E. Tuttle, and which is now U.S. Pat. No. 5,480,834.

FIELD OF THE INVENTION

The invention relates to semiconductor flip chip technology and more particularly to conductive epoxy attachment of a die pad to a supporting substrate.

BACKGROUND OF THE INVENTION

Flip chip interconnections made to connect a semiconductor die pad circuit to a semiconductor supporting substrate have historically been made with exotic plating methods and reflow solder attachment. More recently electrically conductive epoxy has been used to make the flip chip interconnections. These conductive epoxy interconnects have typically been plagued with high contact resistance. For example, when used to contact an aluminum bond pad, which is the semiconductor industry standard, a tenacious nonconductive oxide coated surface forms in a short amount of time, even at room temperature. Because of the nonconductive oxides present, electrically conductive epoxies on otherwise bare aluminum form an interconnect having an extremely high contact resistance. The resistance typically ranges from hundreds of ohms to millions of ohms.

In an effort to reduce the contact resistance a more noble metal, such as gold, has been used to provide a very inert, oxide free surface over which the conductive epoxy may be applied. Gold precludes the formation of nonconductive metal oxides at the surface of the contact. Thus gold, plated on an existing contact, has a direct low contact resistance when it is bonded with a conductive epoxy. However the gold plating of a semiconductor die pad is an elaborate process that can be very difficult, expensive and time consuming. It is very difficult because the process is typically not an electroless deposition process and therefore requires the substrates to be electrically connected to a power supply.

In another method to reduce the contact resistance the oxide formed during the epoxy application is mechanically removed, typically with abrasive action. In a further method the base metal is subjected to a chemical pre-treatment to prohibit oxide formation.

Therefore there exists a need for a flip-chip surface mount device wherein a supporting substrate and a die pad are epoxy bonded efficiently with a low contact resistance.

SUMMARY OF THE INVENTION

The invention is a bonding interconnect comprising a bond pad portion and a conductive epoxy portion. The conductive epoxy portion comprises an oxide reducing agent which reduces oxides formed on the bond pad. The conductive epoxy is cured to bond the epoxy to the plated portion.

The bonding interconnect of the invention has a low contact resistance and creates a good electrical interconnect to bond a die pad to a supporting substrate.

DETAILED DESCRIPTION OF THE INVENTION

The invention is an inexpensive low contact resistance electrical bonding interconnect and the method of forming the bonding interconnect. The bonding interconnect comprises a metal bond pad portion and a conductive epoxy portion. The conductive epoxy portion comprises a metal oxide reducing agent for reducing oxides formed on the metal bond pad.

The following description describes the electrical bonding interconnect and method of forming the electrical bonding interconnect.

Figure 1A:
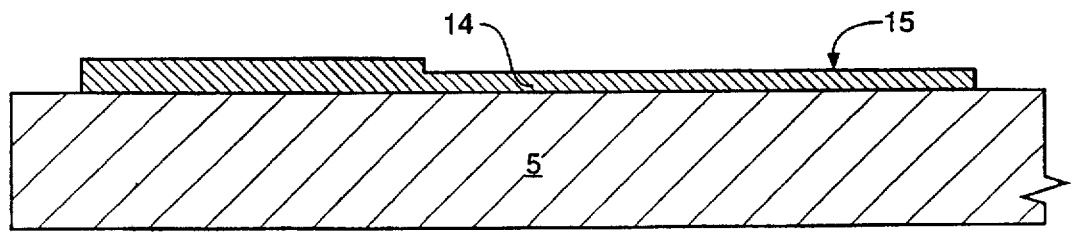
FIG. 1A is a supporting substrate having circuit trace.
Figure 1B:
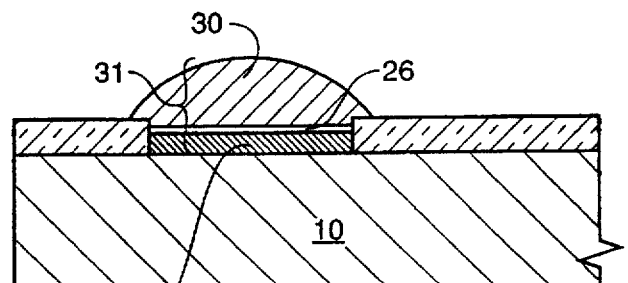
FIG. 1B depicts a die pad having a copper plated bond pad bonded to conductive epoxy.

FIG. 1A depicts a supporting substrate 5, and FIG. 1B depicts a die pad 10. The die pad 10 typically consists of circuitry fabricated on a semiconductor substrate. The supporting substrate 5 is fabricated to have a circuit trace 14. A portion of the circuit trace 14 is an electrical contact area 15.

The die pad 10 is fabricated to have an electrical contact area 20. The contact area 20 is also referred to as a bond pad. Because of practical manufacturing considerations the contact area 20 of the present embodiment is aluminum, although other conductive metals may be used.

The exposed aluminum on the die pad 10 is electroless copper plated to form a copper layer 26. Electroless copper plating is well known to those skilled in the art. Although copper is the metal of choice in the preferred embodiment other conductive metals may be used in place of copper.

Conductive epoxy 30 is formulated to have a copper oxide reducing agent and is applied to the copper layer 26 overlying contact area 20. The copper layer 26 forms an interface layer on the aluminum contact area 20 in order to provide a desired surface for the conductive epoxy 30. In this embodiment the copper layer 26 and the contact area 20 form the metal bond pad portion and the conductive epoxy 30 forms the conductive epoxy portion of the electrical bonding interconnect 31. The epoxy is cured to harden it and increase the adhesive bond between the conductive epoxy 30 and the copper layer 26, thereby completing the fabrication of the electrical bonding interconnect.

A wide variety of metal oxide reducing agents are compatible with the epoxy used in the epoxy industry, including, but not limited to, alkoxylated polyalkyl amine and ethylene diamine. One example of an epoxy containing a curing agent which is also a copper oxide reducing agent that was found to have a very low contact resistance is manufactured by Tra-Con, incorporated located at 55 North Street, Medford, Mass. 02155. The specific material was Tra-Con hardener "Tra-Duct 2922 Hardener", containing in significant part polyalkyl amine and ethylene diamine. Other epoxies contain curing agents which are not oxide reducing agents, and accordingly were ineffective in reducing copper oxide. One example of an ineffective material, having no alkoxylated polyalkyl amine or ethylene diamine, is "Ablebond 8380"

manufactured by Ablestik located at 20021 Suzana Road, Rancho Dominguez, Calif.

If a metal other than copper is plated onto the contact area 20, the oxide reducing agent in the conductive epoxy is selected to reduce the oxides formed before and/or during the process of the invention.

In one method the conductive epoxy portion 30 is applied to the die pad by placing a screen over the die pad 10 and over the copper layer 26. Correct positioning of the screen aligns a screen opening with the contact area 20. The screen opening is filled with the conductive epoxy and excess epoxy is removed. The screen is then removed and the conductive epoxy portion 30 overlying the contact area 15 remains.

Figure 2:
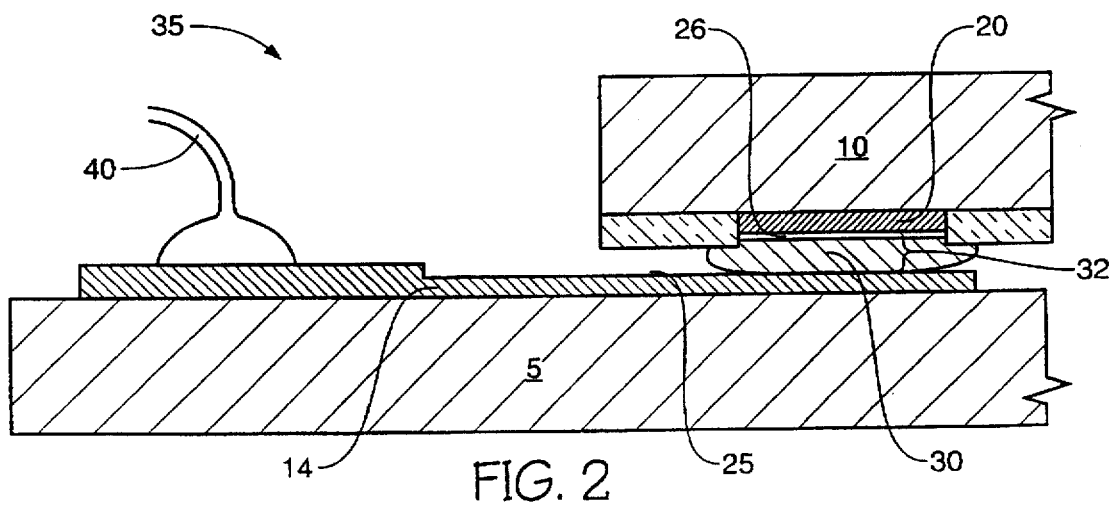
FIG. 2 depicts a memory module comprising the supporting substrate and die pad of FIG. 1.

The process can be continued to form a memory module 35 shown in FIG. 2. In one embodiment a small amount of liquid conductive epoxy is applied to the contact area 15 of the substrate 5. The die pad 10 is positioned over the supporting substrate 5 such that the contact areas 15 and 20 are aligned. The cured epoxy functions as a standoff between the die pad 10 and substrate 5. The wet epoxy is then cured, bonding the die pad 10 and the substrate 5 together. A wire bond 40 may be used to electrically connect the supporting substrate to an external electrical connection.

Figure 4:
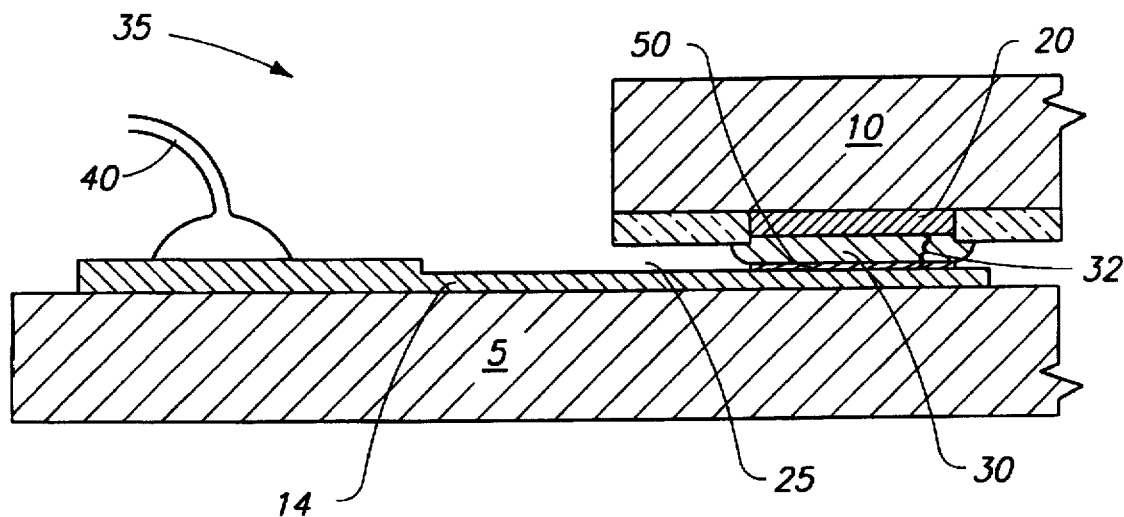
FIG. 4 is an alternate embodiment to that depicted by FIG. 2.

FIG. 4 illustrates the described intervening layer 50 of electrically conductive epoxy which is interposed between and bonding the bonding area of the circuit trace 14 and the conductive epoxy bump 30 together.

Figure 3:
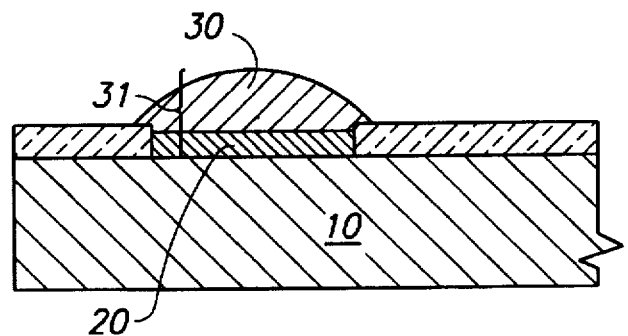
FIG. 3 is an alternate embodiment to that depicted by FIG. 1B.

Although the bonding pad of the described embodiment comprises a first conductive layer and a plated layer the invention is equally applicable in the case where the conductive epoxy is applied to a conductive layer which is not plated. FIG. 3 illustrates such a construction.

Since the oxides formed on the copper are reduced by the method of the invention the contact resistance between the epoxy and the copper is reduced, and consequently there is a low contact resistance between the epoxy and copper. Thus an effective method has been developed to inexpensively and efficiently provide a low contact resistance electrical interconnect.

Although the invention has been described in terms of forming an electrical bonding interconnect on a die pad, the circuit and method of the invention have utility in other circuits where an electrical interconnect is desired. Accordingly the invention should be read as limited only by the claims.

What is claimed is:

1. An electronic circuit bonding interconnect component comprising:
   a semiconductor die comprising integrated circuitry fabricated therewithin;
   a conductive bonding area on the surface of the die and in electrical connection with the die integrated circuitry, the conductive bonding area comprising an outermost metal surface fabricated of an ambient oxidizable metal; and
   an electrically conductive epoxy bump bonded to the conductive bonding area, the conductive epoxy bump being at least partially cured, the interconnect being void of any appreciable ambient oxidizable metal intermediate the bonded conductive epoxy bump and bond pad outermost metal surface, the conductive epoxy bump comprising an oxide reducing agent capable of reducing oxides of the oxidizable metal.

2. An electronic circuit bonding interconnect component comprising:
   a semiconductor die comprising integrated circuitry fabricated therewithin;
   a conductive bonding area on the surface of the die and in electrical connection with the die integrated circuitry, the conductive bonding area comprising an outermost metal surface fabricated of an ambient oxidizable metal; and
   an electrically conductive epoxy bump bonded to the conductive bonding area, the conductive epoxy bump being at least partially cured, the interconnect being void of any appreciable ambient oxidizable metal intermediate the bonded conductive epoxy bump and bond pad outermost metal surface, the conductive epoxy bump covering all of the conductive bonding area and extending laterally outward therebeyond.

3. A flip chip interconnect bond comprising:
   a semiconductor die comprising integrated circuitry fabricated therewithin, a conductive bonding area on the surface of the die and in electrical connection with the die integrated circuitry, the conductive bonding area comprising an outermost metal surface fabricated of an ambient oxidizable metal; and an electrically conductive epoxy bump bonded to the conductive bonding area, the semiconductor die being void of any appreciable ambient oxidizable metal intermediate the bonded conductive epoxy bump and the conductive bonding area outermost metal surface; and
   a circuit substrate comprising a surface circuit trace, the circuit trace defining a bonding area, the semiconductor die being flip chip bonded to the substrate bonding area through the conductive epoxy bump, with a layer of electrically conductive epoxy being interposed between the bonding area of the circuit trace and the conductive epoxy bump, the conductive epoxy bump comprising an oxide reducing agent capable of reducing oxides of the oxidizable metal.

4. A flip chip interconnect bond comprising:
   a semiconductor die comprising integrated circuitry fabricated therewithin, a conductive bonding area on the surface of the die and in electrical connection with the die integrated circuitry, the conductive bonding area comprising an outermost metal surface fabricated of an ambient oxidizable metal; and an electrically conductive epoxy bump bonded to the conductive bonding area, the semiconductor die being void of any appreciable ambient oxidizable metal intermediate the bonded conductive epoxy bump and the conductive bonding area outermost metal surface; and
   a circuit substrate comprising a surface circuit trace, the circuit trace defining a bonding area, the semiconductor die being flip chip bonded to the substrate bonding area through the conductive epoxy bump, with a layer of electrically conductive epoxy being interposed between the bonding area of the circuit trace and the conductive epoxy bump;
   the conductive epoxy bump covering all of the semiconductor die conductive bonding area and extending laterally outward therebeyond.

5. An electronic circuit bonding interconnect component comprising:
   a semiconductor die comprising integrated circuitry fabricated therewithin;
   a conductive bonding area on the surface of the die and in electrical connection with the die integrated circuitry, the conductive bonding area comprising an outermost metal surface fabricated of an ambient oxidizable metal; and an electrically conductive epoxy bump bonded to the conductive bonding area, the conductive epoxy bump comprising an oxide reducing agent capable of reducing oxides of the oxidizable metal.

6. The interconnect component of claim 5 wherein the oxidizable metal comprises aluminum.

7. The interconnect component of claim 5 wherein the oxidizable metal comprises copper.

8. An electronic circuit bonding interconnect component comprising:

a semiconductor die comprising integrated circuitry fabricated therewithin;

a conductive bonding area on the surface of the die and in electrical connection with the die integrated circuitry; and an electrically conductive epoxy bump bonded to the conductive bonding area, the conductive epoxy bump covering all of the conductive bonding area and extending laterally outward therebeyond.

9. A flip chip interconnect bond comprising:

a semiconductor die comprising integrated circuitry fabricated therewithin, a conductive bonding area on the surface of the die and in electrical connection with the die integrated circuitry, the conductive bonding area comprising an outermost metal surface fabricated of an ambient oxidizable metal; and an electrically conductive epoxy bump bonded to the conductive bonding area; and a circuit substrate comprising a surface circuit trace, the circuit trace defining a bonding area, the semiconductor die being flip chip bonded to the substrate bonding area through the conductive epoxy bump, with a layer of electrically conductive epoxy being interposed between the bonding area of the circuit trace and the conductive epoxy bump, the conductive epoxy bump comprising an oxide reducing agent capable of reducing oxides of the oxidizable metal.

10. The interconnect component of claim 9 wherein the oxidizable metal comprises aluminum.

11. The interconnect component of claim 9 wherein the oxidizable metal comprises copper.

12. A flip chip interconnect bond comprising:

a semiconductor die comprising integrated circuitry fabricated therewithin, a conductive bonding area on the surface of the die and in electrical connection with the die integrated circuitry, and an electrically conductive epoxy bump bonded to the conductive bonding area; and a circuit substrate comprising a surface circuit trace, the circuit trace defining a bonding area, the semiconductor die being flip chip bonded to the substrate bonding area through the conductive epoxy bump, with a layer of electrically conductive epoxy being interposed between the bonding area of the circuit trace and the conductive epoxy bump;

the conductive epoxy bump covering all of the semiconductor die conductive bonding area and extending laterally outward therebeyond.

13. An electronic circuit bonding interconnect component comprising:

a semiconductor die comprising integrated circuitry fabricated therewithin;

a conductive bonding pad on the surface of the die and in electrical connection with the die integrated circuitry, the conductive bonding pad comprising an inner layer of aluminum and an outer layer of copper; and an electrically conductive epoxy bump bonded to the copper, the conductive epoxy bump comprising an oxide reducing agent capable of reducing oxides of the copper.

14. An electronic circuit bonding interconnect component comprising:

a semiconductor die comprising integrated circuitry fabricated therewithin;

a conductive bonding pad on the surface of the die and in electrical connection with the die integrated circuitry, the conductive bonding pad comprising an inner layer of a first metal and an outer layer of a second metal, the first and second metals being different from one another, the second metal comprising copper; and an electrically conductive epoxy bump bonded to the copper, the conductive epoxy bump comprising an oxide reducing agent capable of reducing oxides of the copper.

* * * * *